(12) United States Patent
Solt

(10) Patent No.: US 9,726,722 B1
(45) Date of Patent: Aug. 8, 2017

(54) SYSTEMS AND METHODS FOR AUTOMATIC TEST PATTERN GENERATION FOR INTEGRATED CIRCUIT TECHNOLOGIES

(71) Applicant: Marvell Israel (M.I.S.L) Ltd., Yokneam (IL)

(72) Inventor: Yosef Solt, Atzmon-Segev (IL)

(73) Assignee: MARVELL ISRAEL (M.I.S.L.) LTD, Yokneam (IL)

( * ) Notice: Subject to any disclaimer, the term of this patent is extended or adjusted under 35 U.S.C. 154(b) by 617 days.

(21) Appl. No.: 14/284,923

(22) Filed: May 22, 2014

Related U.S. Application Data

(60) Provisional application No. 61/827,236, filed on May 24, 2013.

(51) Int. Cl.
| | | |
|---|---|---|
| G01R 31/317 | (2006.01) | |
| G01R 31/28 | (2006.01) | |
| G01R 31/3185 | (2006.01) | |
| G01R 31/302 | (2006.01) | |
| G01R 31/3177 | (2006.01) | |

(52) U.S. Cl.
CPC ... *G01R 31/31712* (2013.01); *G01R 31/3025* (2013.01); *G01R 31/3177* (2013.01); *G01R 31/318555* (2013.01)

(58) Field of Classification Search
CPC ........ G01R 31/3025; G01R 31/318555; G01R 31/31712
USPC ....... 702/117, 118; 324/537, 750.3; 714/726, 714/727, 729, 731, 738, 724, 26
See application file for complete search history.

(56) References Cited

U.S. PATENT DOCUMENTS

2006/0242499 A1* 10/2006 Volz .................. G01R 31/3025
714/724
2009/0309609 A1* 12/2009 De Jong ........ G01R 31/318555
324/537

* cited by examiner

*Primary Examiner* — John H Le

(57) ABSTRACT

Systems and methods are provided for an integrated circuit system. A plurality of separate integrated circuit dies are coupled together to form an integrated circuit package, a first integrated circuit die including an input and a last integrated circuit die including an output, ones of the plurality of integrated circuit dies including a testing circuit associated with a corresponding integrated circuit die. The testing circuit includes a testing path for testing functionality of the corresponding integrated circuit die, a bypass path bypassing the testing path, and control circuitry for selecting between an output of the testing path and an output of the bypass path, the control circuitry being configured to select the output of the testing path or the output of the bypass path and to pass the selected output to a subsequent integrated circuit die among the plurality of coupled circuit dies.

16 Claims, 7 Drawing Sheets

SYSTEMS AND METHODS FOR AUTOMATIC TEST PATTERN GENERATION FOR INTEGRATED CIRCUIT TECHNOLOGIES

CROSS-REFERENCE TO RELATED APPLICATIONS

The present application claims priority from U.S. Provisional Application Ser. No. 61/827,236 entitled "Automatic Test Pattern Generation for 2.5D Integrated Circuit Technologies," filed 24 May 2013, the entirety of which is hereby incorporated by reference.

FIELD

This disclosure is related generally to integrated circuit testing and more particularly integrated circuit scan chain testing.

BACKGROUND

The manufacture of integrated circuit dies necessitates coping with various challenges, including challenges related to testing the manufactured circuit dies to ensure their proper operation. For example, once integrated circuit dies are incorporated into larger systems, for example into multi-chip devices, the testability of individual dies may be reduced due to limited access to integrated circuit die pins.

The description above is presented as a general overview of related art in this field and should not be construed as an admission that any of the information it contains constitutes prior art against the present patent application.

SUMMARY

Systems and methods are provided for an integrated circuit system. A plurality of separate integrated circuit dies are coupled to form an integrated circuit package, a first integrated circuit die including an input and a last integrated circuit die including an output, ones of the plurality of integrated circuit dies including a testing circuit associated with a corresponding integrated circuit die. The testing circuit includes a testing path for testing functionality of the corresponding integrated circuit die, a bypass path bypassing the testing path, and control circuitry for selecting between an output of the testing path and an output of the bypass path, the control circuitry being configured to select the output of the testing path or the output of the bypass path and pass the selected output to a subsequent integrated circuit die among the plurality of circuit dies.

As another example, a method of testing a plurality of mutually interconnected integrated circuit dies forming an integrated circuit system includes receiving test stimulus data at an input of a first integrated circuit die of the plurality of serially connected integrated circuit dies. A determination is made as to whether the first integrated circuit die is currently being tested at a testing circuit of the first integrated circuit die. Test results data is transmitted from a testing path of the testing circuit of the first integrated circuit die to a next integrated circuit die when the first integrated circuit die is currently being tested. The test stimulus data is transmitted from a bypass path of the testing circuit of the first integrated circuit die to the next integrated circuit die when the first integrated circuit die is not currently being tested. Data from the first integrated circuit die is received at the next integrated circuit die, the received data being test results data or test stimulus data. A determination is made as to whether the next integrated circuit die is currently being tested at a testing circuit of the next integrated circuit die. Test results data is transmitted from a testing path of the testing circuit of the next integrated circuit die when the next integrated circuit die is currently being tested. The received data from the first integrated circuit die is transmitted from a bypass path of the testing circuit of the next integrated circuit die when the next integrated circuit die is not currently being tested.

As a further example, a method of testing integrated circuit dies includes sequentially transmitting a series of particular testing patterns to a plurality of first integrated circuit dies, one particular testing pattern being transmitted to each of the first integrated circuit dies, the first integrated circuit dies being unconnected to others of the first integrated circuit dies as part of an integrated circuit package. Test results data is received from each of the first integrated circuit dies. A fault is identified in one or more of the first integrated circuit dies based on the received test results data from the first integrated circuit dies. The series of particular test patterns is sequentially transmitted to a plurality of second integrated circuit dies via an input of an initial integrated circuit die of the second integrated circuit dies, the second integrated circuit dies being coupled via an integrated circuit package. Test results data is received from each of the second integrated circuit dies via an output of a final integrated circuit die of the second integrated circuit dies, and a fault is identified in one or more of the second integrated circuit dies based on the received test results data from the second integrated circuit dies.

DETAILED DESCRIPTION

Figure 1A:
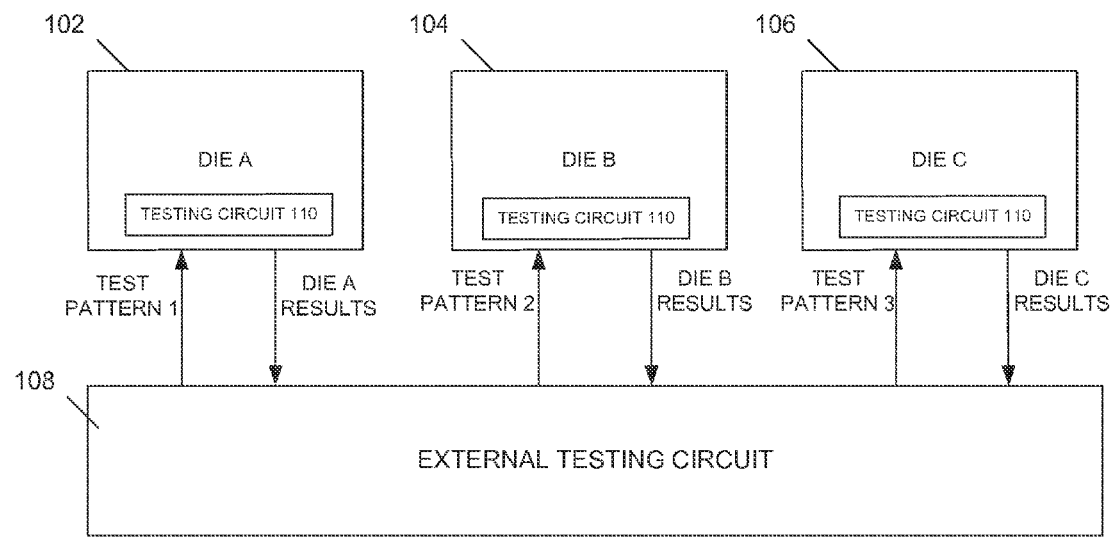
FIGS. 1A and 1B are block diagrams depicting an integrated circuit system configured to provide both sort and final testing using common test stimulus data.
Figure 1B:
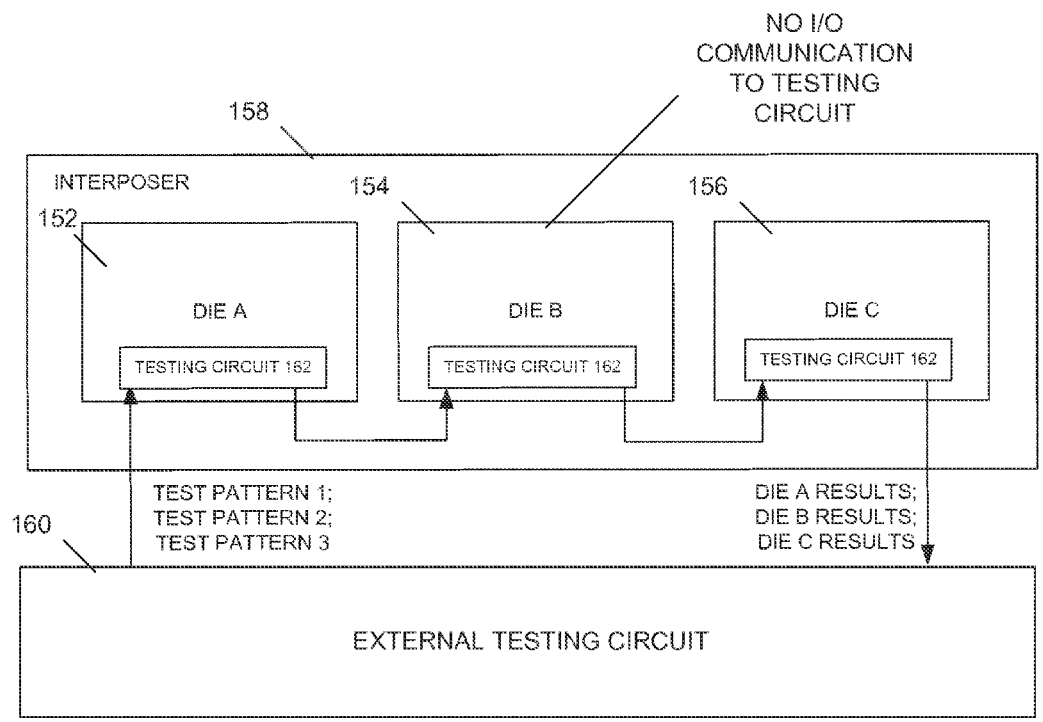

FIGS. 1A and 1B are block diagrams depicting an integrated circuit system configured to provide both sort and final testing using common test stimulus data. FIG. 1A depicts an integrated circuit system configured for sort testing of a number of integrated circuit dies 102, 104, 106. Sort testing, sometimes referred to as wafer testing, wafer sort, electronic die sort, or circuit probe testing, is typically performed during semiconductor device fabrication prior to integrated circuit dies being integrated along with other integrated circuit dies and other components into an integrated circuit package. During sort testing, pins of each integrated circuit die are typically accessible for testing. During sort testing, each integrated circuit die 102, 104, 106 is individually connected to an external testing circuit 108. The external testing circuit 108 sequentially transmits a series of particular testing patterns (e.g., test pattern 1, test pattern 2, test pattern 3) to each of the integrated circuit dies 102, 104, 106, respectively. During scan testing, the integrated circuit dies 102, 104, 106 are unconnected to one another. In one embodiment of the disclosure, the testing patterns (test stimulus) are all the same. In another embodiment of the disclosure, the testing patterns are different (e.g., based on the integrated circuit dies 102, 104, 106 being of different types, based on a testing protocol where differing (e.g., random) data is provided to each of the integrated circuit dies 102, 104, 106 being tested). Based on the testing pattern provided from the external testing circuit 108, each of the integrated circuit dies 102, 104, 106 generates test results data and transmits the generated test results data to the external testing circuit 108. In one embodiment, each of the integrated circuit packages includes a testing circuit 110 that is configured to perform a scan chain testing operation where a pattern of data is provided to the integrated circuit die for storage using a shift register followed by an outputting of the stored data using the shift register to determine whether the pattern of data was stored correctly.

FIG. 1B depicts an integrated circuit system configured for testing of integrated circuit dies after the integrated circuit dies have been incorporated into an integrated circuit package. Such testing is sometimes referred to as final testing. Final testing is typically more limited than scan testing because not all of the integrated circuit dies have pins that are available for access by an external testing circuit. With reference to FIG. 1B, a plurality of integrated circuit dies 152, 154, 156 are incorporated into an integrated circuit package, where the integrated circuit dies 152, 154, 156 are mutually interconnected via an interposer 158 (e.g., as part of a 2.5 dimensional (2.5D) integrated circuit package or any other integration of multiple dies in a single package such as 3 dimensional (3D), die tower, or multi-chip module (MCM)). In the present embodiment only integrated circuit die A 152 and integrated circuit die C 156 are connected to external I/O pads of the interposer 158. Thus, integrated circuit die B 154 has no dedicated external connection with which to communicate with an external testing circuit 160.

To facilitate final testing of the integrated circuit dies 152, 154, 156, such as to verify their continued functionality and the success of their interposer 158 interconnections, the integrated circuit dies 152, 154, 156 are logically ordered to facilitate sequential communication with one another. In one embodiment of the disclosure, the integrated circuit dies 152, 154, 156 are physically connected (e.g., via one or more traces) in such a serial order, while in another embodiment, the integrated circuit dies 152, 154, 156 utilize mutual interconnections of the interposer 158 to facilitate such sequential communication. The testing circuits 162 of the integrated circuit dies 152, 154, 156 are configured to facilitate passing test stimulus from an integrated circuit die (e.g., integrated circuit die A 152) having an external interposer 158 input connection to integrated circuit dies (e.g., integrated circuit die B 154) lacking such an external connection. Similarly, the testing circuits 162 are configured to facilitate transmission of test results data from integrated circuit dies (e.g., integrated circuit die B 154) lacking an external output connection to another integrated circuit die (e.g., integrated circuit die C 156) having such an external output connection.

In operation, in one embodiment of the disclosure, the external testing circuit 160 sequentially transmits testing patterns (e.g., the same test pattern 1, test pattern 2, and test pattern 3 transmitted in FIG. 1A) to a first integrated circuit die A 152 having an external input connection via the interposer 158. Each integrated circuit die 152, 154, 156 determines whether it is the integrated circuit die to be tested in a current cycle. If that integrated circuit die is the intended target of the current test pattern, then that integrated circuit die uses that test pattern to generate test results data which is passed to the remaining integrated circuit dies and out an external output of the last integrated circuit die C 156. If that integrated circuit die is not the intended target of the current test pattern, then that integrated circuit die: passes the test pattern to subsequent integrated circuit dies when a subsequent integrated circuit die in the logical order is the integrated circuit die to be tested; and passes results data received from a prior integrated circuit in the logical order when a prior integrated circuit die in the logical order is the integrated circuit die to be testing.

Figure 2:
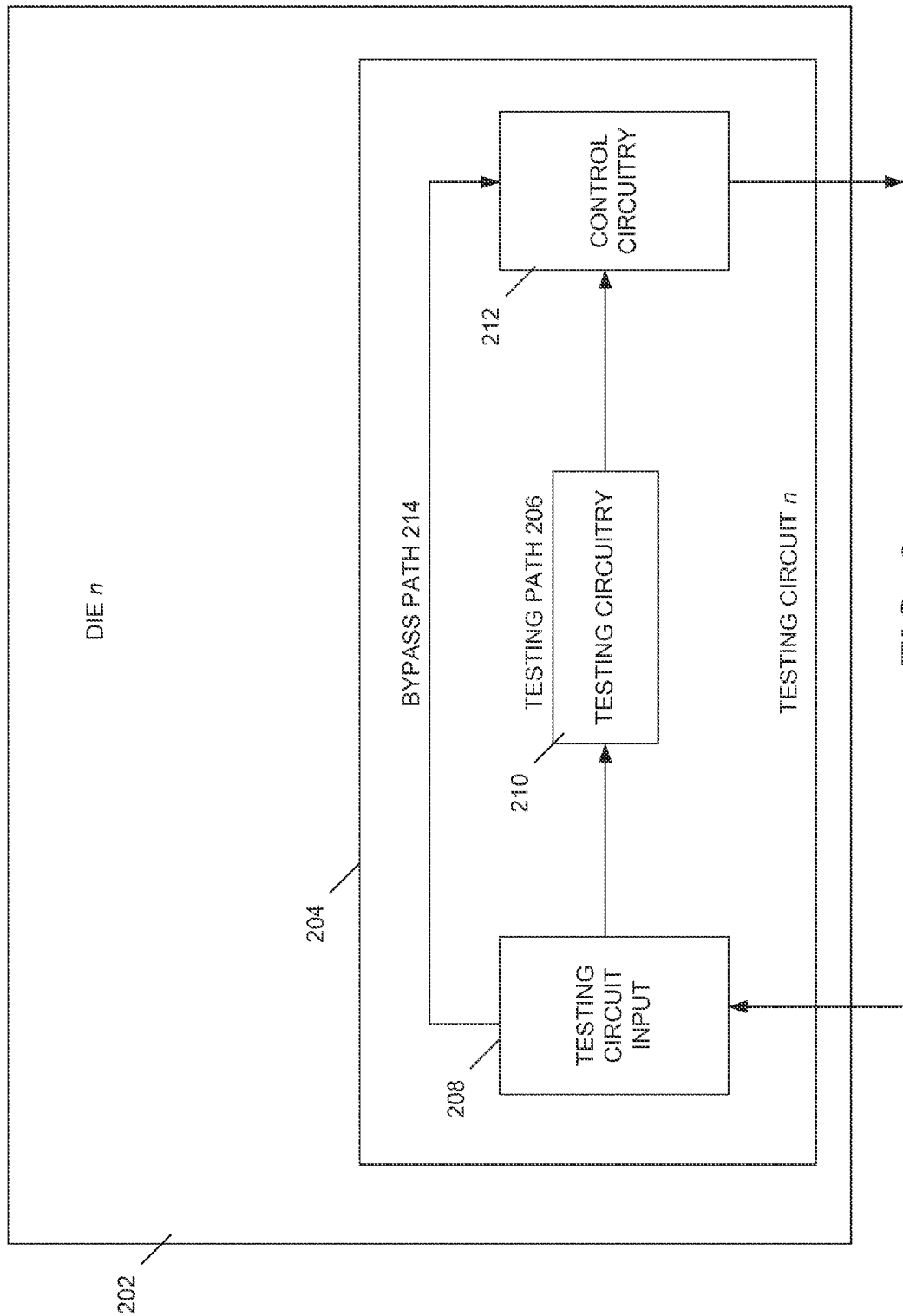
FIG. 2 is a block diagram depicting a testing circuit and a corresponding integrated circuit die.

FIG. 2 is a block diagram depicting a testing circuit and a corresponding integrated circuit die. The integrated circuit die 202 (e.g., integrated circuit die n of m total integrated circuit dies) is configured for coupling with other integrated circuit dies to form an integrated circuit package. The integrated circuit die 202 includes a testing circuit 204 that is associated with the corresponding integrated circuit die 202. The testing circuit 204 includes a testing path 206 for testing the functionality of the corresponding integrated circuit die 202. When the testing circuit 204 receives test stimulus data at its input 208 that is intended for testing the functionality of the corresponding integrated circuit die 202, testing circuitry 210 connected to the testing path 206 generates test results data based on the test stimulus data that is passed to control circuitry 212. When the testing circuit 204 receives data at its input 208 that is not intended to be used for testing the functionality of the corresponding integrated circuit die 202, then that received data is passed to the control circuitry 212 via a bypass path 214 that bypasses the testing path 206 without modification of the received data.

As noted above, in one embodiment of the disclosure, during final testing, where a plurality of integrated circuit dies have been coupled to form an integrated circuit package, the integrated circuit dies are put into a logical order. Depending on which of the integrated circuit dies in the logical order is to be tested during a current cycle, the input to the testing circuit 204 of the depicted integrated circuit die 202 received at 208 is either test stimulus data or test results data. When a previous integrated circuit die in the logical order is to be tested during a current cycle, then the testing circuit input 208 receives test results data from that previous integrated circuit die to be passed along the logical order of integrated circuit dies to a last integrated circuit die having an external I/O connection for outputting the test results data to the external testing circuit. When the depicted integrated circuit die 202 or an integrated circuit die subsequent to the depicted integrated circuit die 202 in the logical order is to be tested during the current cycle, then the testing circuit input 208 receives test stimulus data from a prior integrated circuit die in the logical order (or from the external testing circuit when the depicted integrated circuit die 202 is the first integrated circuit die in the logical order).

The control circuitry 212 is configured for selecting between an output of the testing path 206 and an output of the bypass path 214 to output to downstream circuitry, such as a later integrated circuit die in the logical order or to the external testing circuit. In one embodiment of the disclosure, the control circuitry determines whether to pass output from the testing path 206 or the bypass path 214 based on an indicator included in the test stimulus data that indicates which integrated circuit die is to be tested in the current cycle. In another embodiment, the control circuit 212 determines from which path 206, 214 to pass data based on an external signal received at the testing circuit 204 of the integrated circuit die 202. In a further embodiment, the control circuit 212 determines from which path 206, 214 to pass data based on a timing of data received at the input 208 of the testing circuit 204 (e.g., when the depicted integrated circuit die is identified as the third integrated circuit die in the logical order and a third set of data is received at the input, the testing circuit 204 determines that the depicted integrated circuit die 202 is to be tested during the current cycle).

During sort testing, only the testing path 206 is utilized, where test stimulus data is received from the external testing circuit at 208, processed by the testing circuitry at 210, and outputted by the control circuitry 212 to the external testing circuitry for verification of proper function of the integrated circuit die 202.

Figure 3:
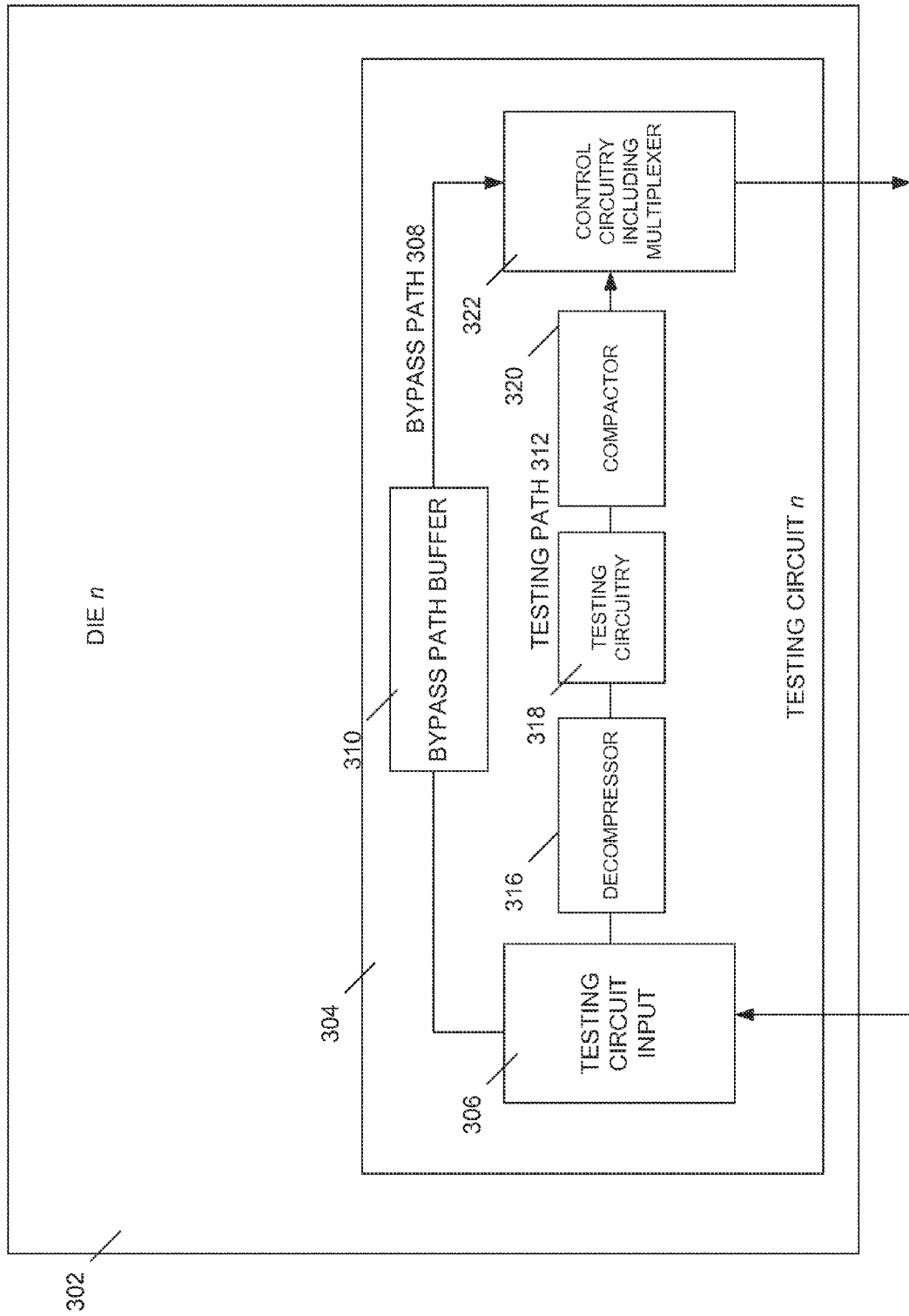
FIG. 3 is a block diagram depicting an implementation of a testing circuit in one embodiment of the disclosure.

FIG. 3 is a block diagram depicting an implementation of a testing circuit in one embodiment of the disclosure. An integrated circuit die 302 includes a testing circuit 304. The testing circuit 304 is configured to receive at 306 test stimulus data from an external testing circuit or from a prior integrated circuit die in a logical ordering of integrated circuit dies or test results data from a prior integrated circuit die in the logical ordering that has already performed testing during a current cycle. The received data is provided to a bypass path 308 that includes a bypass buffer 310 that in one embodiment provides a short delay and/or storage of data from the testing circuit input 306 along the bypass path 306.

The testing circuit 304 further includes a testing path 312. In one embodiment of the disclosure, the testing path 312 includes a decompressor circuit 316 configured to decompress test stimulus data. Testing circuitry 318 uses the test stimulus data to test functionality of the integrated circuit die 302. In one embodiment, the testing circuitry 318 comprises conventional scan testing circuitry for testing memory cells of a memory integrated circuit die, where the decompressor 316 provides decompressed scan chain data that is written to the memory cells and then read from the memory cells to determine proper operation of those memory cells. In one embodiment, the testing path 312 further includes a compactor 320 for compacting results from the testing circuit 318 for transmission. In one embodiment, the compactor 320 compacts scan chain test results data read from the memory cells of the integrated circuit die 302 during scan chain testing by the testing circuitry 318. Control circuitry 322 determines whether to transmit an output of the bypass path 308 (e.g., data from the external testing circuit or a prior integrated circuit die) or an output of the testing path 312 to transmit from the testing circuit. When the depicted integrated circuit die 302 is the integrated circuit die to be tested during the current cycle, then the control circuitry 322 is configured to select data from the testing path 312 to transmit. When another integrated circuit die is to be tested during the current cycle, then the control circuitry 322 is configured to select data from the bypass path 308 to transmit. In one embodiment, when the depicted integrated circuit die 302 in undergoing scan testing, where integrated circuit dies are being tested individually (e.g., sort testing) prior to connection to other integrated circuit dies, the control circuitry 322 is configured to select the testing path 312. In one embodiment, the control circuitry 322 comprises a multiplexer that selects a path 308, 312 based on a selector signal in data received at 306 or based on a selector signal received from outside of the testing circuit 304.

Figure 4:
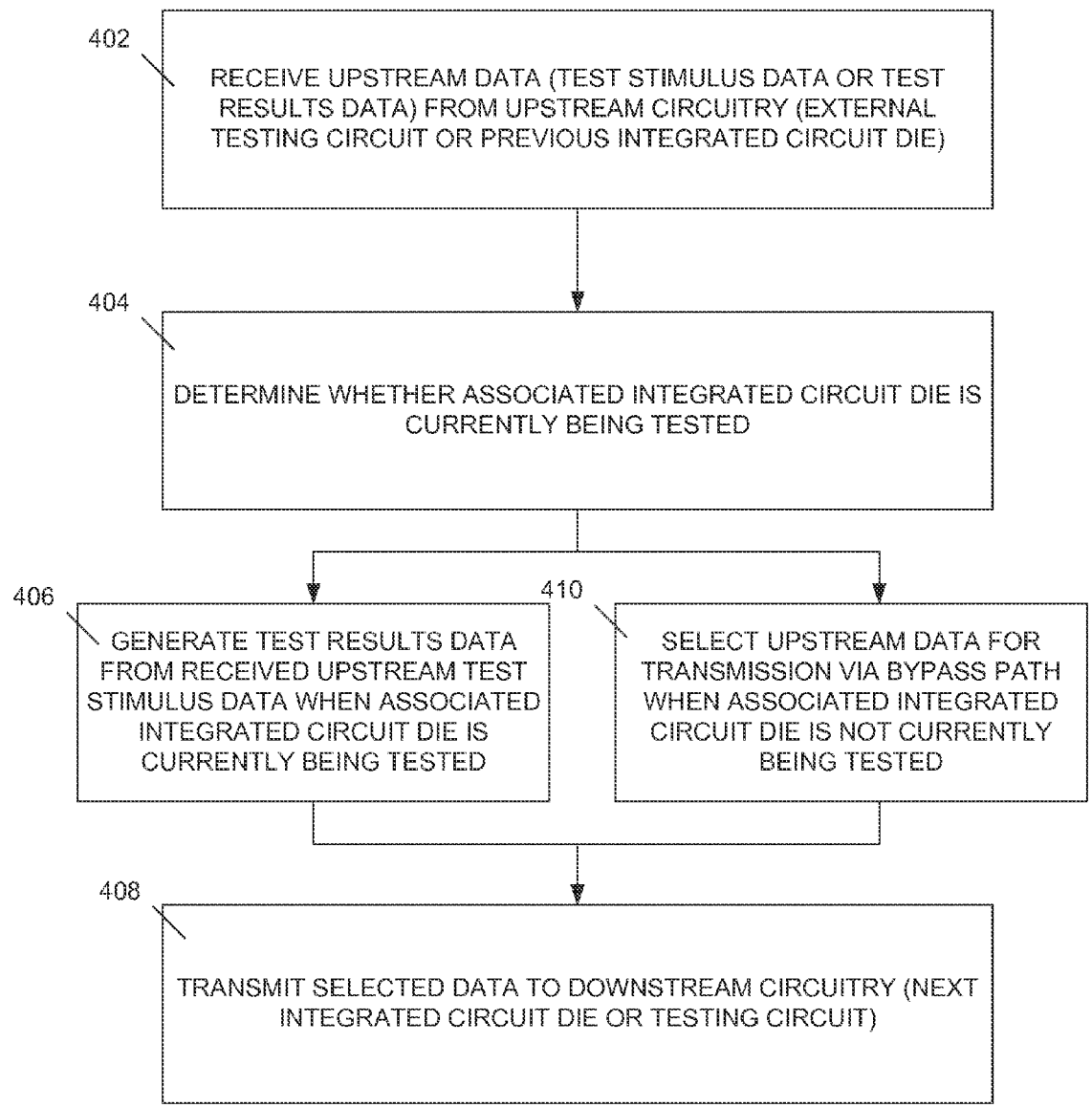
FIG. 4 is a flow diagram depicting example operations of a testing circuit in accordance with one embodiment of the disclosure.

FIG. 4 is a flow diagram depicting example operations of a testing circuit in accordance with one embodiment of the disclosure. At 402, the testing circuit receives upstream data (e.g., test stimulus data or test results data) from upstream circuitry, which is either an external testing circuit or a previous integrated circuit die in a logical ordering of integrated circuit dies. At 404, a determination is made as to whether the integrated circuit die associated with the testing circuit is to be tested in the current cycle. Such a determination is made based on an outside signal (e.g., a selector signal in the data received at 402, a selector signal received from another external source) or based on internal logic at the testing circuit (e.g., when the testing circuit stores information indicating that it is associated with a fourth integrated circuit die in the logical order, the testing circuit determines that its associated integrated circuit die is to be tested on a fourth cycle of testing).

When the determination at 404 indicates that the associated integrated circuit die is to be tested during the current cycle, at 406, test results is generated from received upstream test stimulus data. That test results data is selected for transmission from the testing circuit, and at 408, that test results data is transmitted to downstream circuitry (e.g., a next integrated circuit die in the logical order or to the external testing circuit). When the determination at 404 indicates that the associated integrated circuit die is not to be tested during the current cycle, at 410, the upstream data received at 402 is selected for transmission via a bypass path, and at 408, that upstream data is transmitted to the downstream circuitry.

Figure 5A:
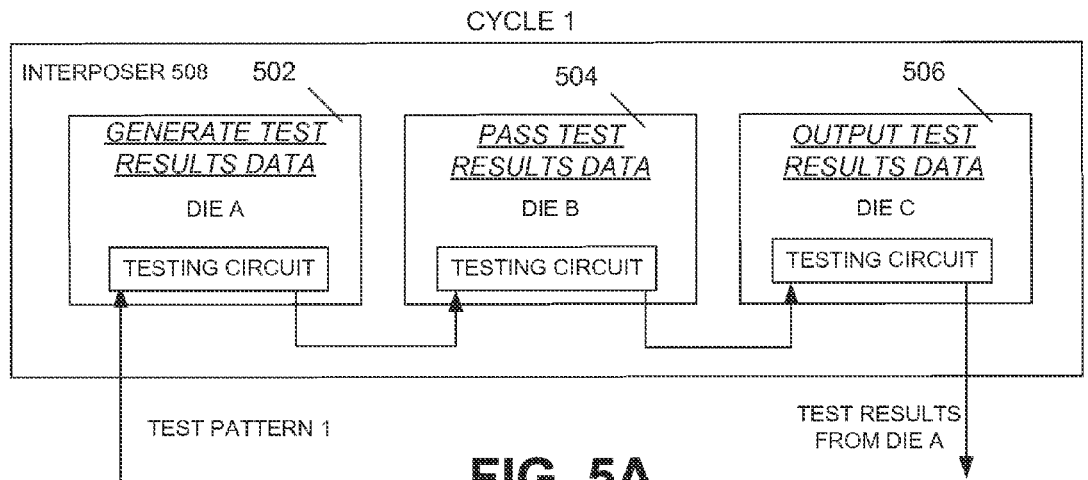
FIGS. 5A-5C depict three testing cycles for an integrated circuit package in accordance with one embodiment of the disclosure.
Figure 5B:
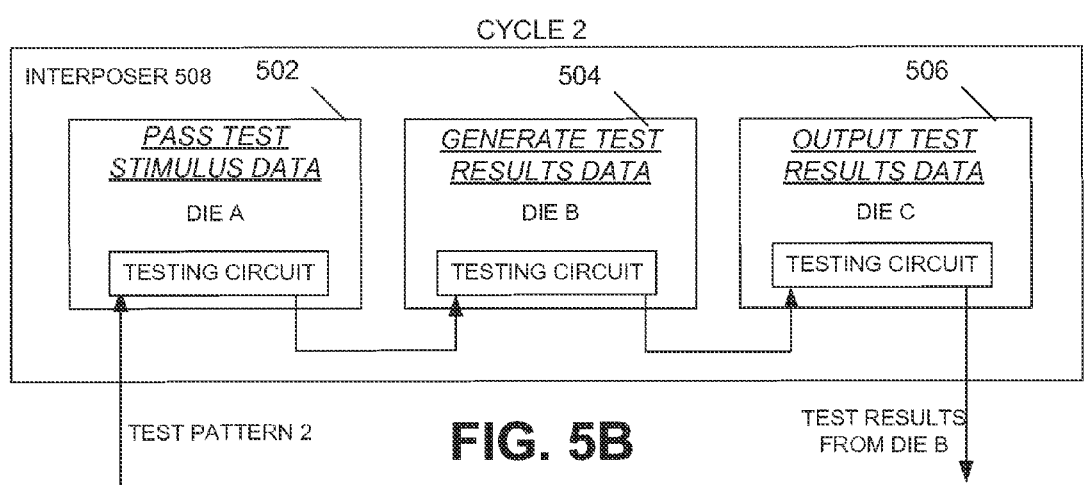
Figure 5C:
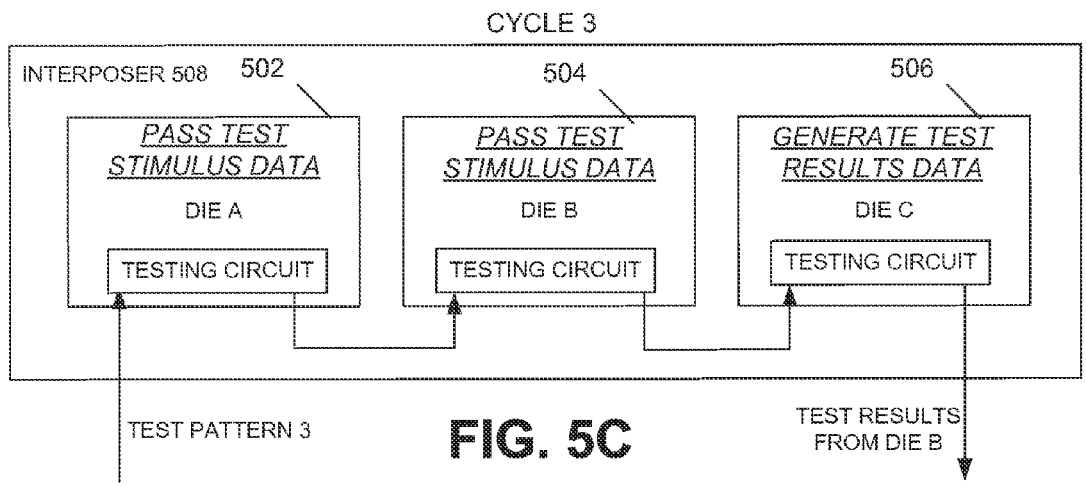

FIGS. 5A-5C depict three testing cycles for an integrated circuit package in accordance with one embodiment of the disclosure. FIG. 5A depicts a first cycle of testing. An external testing circuit transmits a testing pattern to a testing circuit on integrated circuit die A 502, such as via an input/output pad of an interposer 508 that provides mutual connections among integrated circuit dies 502, 504, 506 as part of an integrated circuit package. The testing circuit on integrated circuit die A 502 determines that its corresponding integrated circuit die is to be tested in the current cycle (e.g., based on a selector signal included with test pattern 1). Thus, a testing path within the integrated circuit die A 502 testing circuit uses test pattern 1 to test functionality of integrated circuit die A 502 and generates test results data. The testing circuit of integrated die A 502 selects that test results data for transmission to integrated circuit die B 504. The testing circuit of integrated circuit die B 504 determines that integrated circuit die B 504 is not to be tested in the current cycle (e.g., based on receipt of results data from integrated circuit die A 502). Thus, the integrated circuit die B 504 testing circuit selects an output of a bypass path, which passes the test results data generated at integrated circuit die A 502 to integrated circuit die C 506. Similarly, the testing circuit of integrated circuit die C 506 determines that integrated circuit die C 506 is not to be tested in the current cycle. Thus, the integrated circuit die C 506 testing circuit selects an output of a bypass path, which passes the test results data generated at integrated circuit die A 502 and forwarded to integrated circuit die C 506 via integrated circuit die B 504 to the external testing circuit, such as via an input/output pad of the interposer 508.

FIG. 5B depicts a second cycle of testing. The second cycle of testing is aimed at integrated circuit die B 504. However, integrated circuit die B 504 does not include a direct external connection via which the external testing circuit can communicate with integrated circuit die B 504. Thus, the external testing circuit transmits test pattern 2 to a testing circuit on integrated circuit die A 502, such as via an input/output pad of the interposer 508. The testing circuit on integrated circuit die A 502 determines that its corresponding integrated circuit die is not to be tested in the current cycle. Thus, the integrated circuit die A 502 testing circuit selects an output of a bypass path which passes test pattern 2 to integrated circuit die B 504. The testing circuit on integrated circuit die B 504 determines that its corresponding integrated circuit die is to be tested in the current cycle. Thus, a testing path within the integrated circuit die B 504 testing circuit uses test pattern 2 to test functionality of integrated circuit die B 504 and generates test results data. The testing circuit of integrated die B 504 selects that test results data for transmission to integrated circuit die C 506. The testing circuit of integrated circuit die C 506 determines that integrated circuit die C 506 is not to be tested in the current cycle. Thus, the integrated circuit die C 506 testing circuit selects an output of a bypass path, which passes the test results data generated at integrated circuit die B 504 to the external testing circuit, such as via an input/output pad of the interposer 508.

FIG. 5C depicts a third cycle of testing. The third cycle of testing is aimed at integrated circuit die C 506. The external testing circuit transmits testing pattern 3 to a testing circuit on integrated circuit die A 502, such as via an input/output pad of the interposer 508. The testing circuit on integrated circuit die A 502 determines that its corresponding integrated circuit die is not to be tested in the current cycle. Thus, the integrated circuit die A 502 testing circuit selects an output of a bypass path which passes test pattern 3 to integrated circuit die B 504. The testing circuit of integrated circuit die B 504 determines that integrated circuit die B 504 is not to be tested in the current cycle. Thus, the integrated circuit die B 504 testing circuit selects an output of a bypass path, which passes the test pattern 3 to integrated circuit die C 506. The testing circuit on integrated circuit die C 506 determines that its corresponding integrated circuit die is to be tested in the current cycle. Thus, a testing path within the integrated circuit die C 506 testing circuit uses test pattern 3 to test functionality of integrated circuit die C 506 and generates test results data. The testing circuit of integrated die C 506 selects that test results data for transmission to the external testing circuit.

Figure 6:
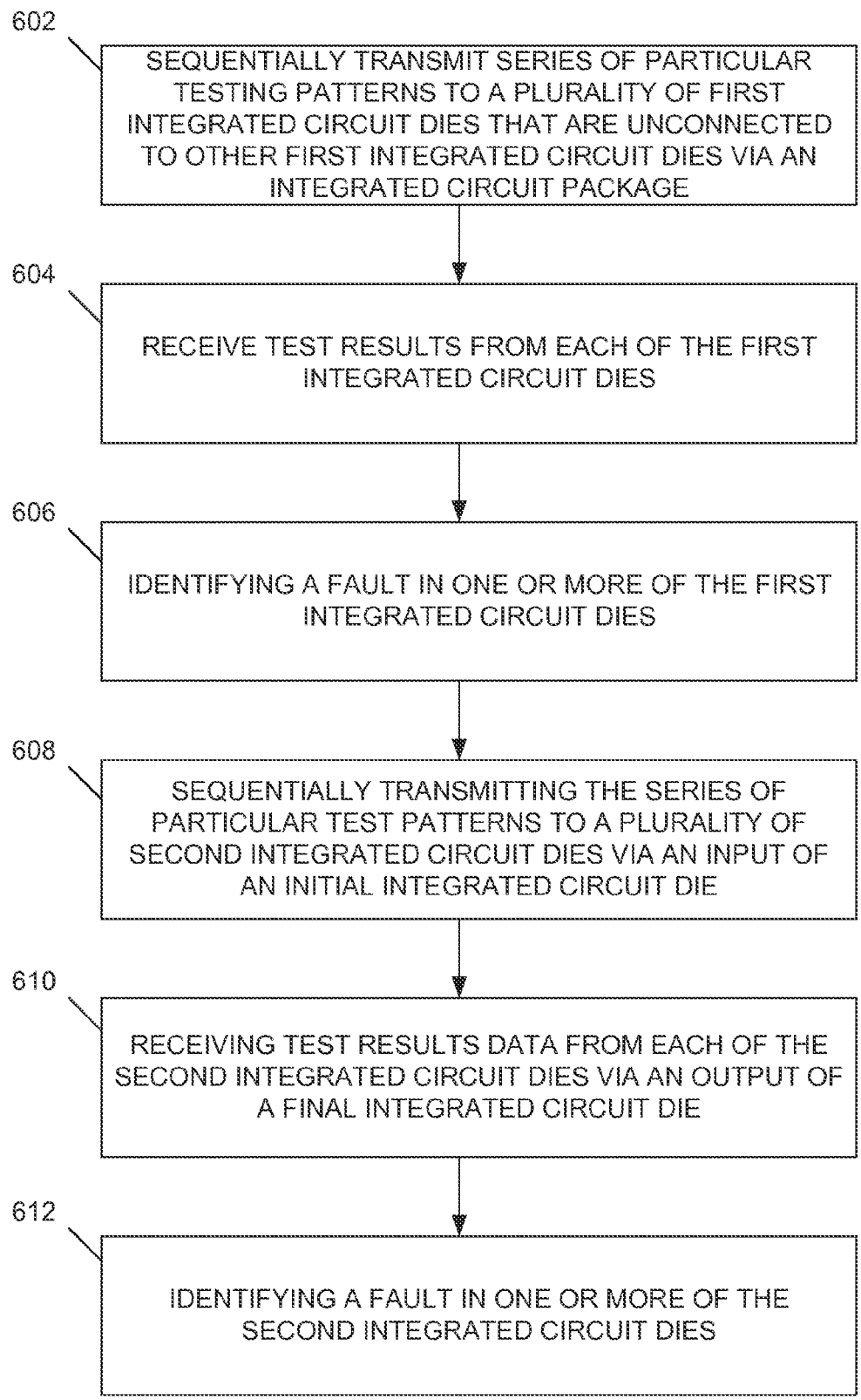
FIG. 6 is a flow diagram depicting a method of testing integrated circuit dies.

FIG. 6 is a flow diagram depicting a method of testing integrated circuit dies. Scan testing of integrated circuit dies prior to connection to other integrated circuit dies as part of an integrated circuit package is performed at 602, 604, 606. Specifically, at 602 a series of particular testing patterns are sequentially transmitted to a plurality of first integrated circuit dies, one particular testing pattern being transmitted to each of the first integrated circuit dies, the first integrated circuit dies being unconnected to others of the first integrated circuit dies as part of an integrated circuit package. At 604, test results data is received from each of the first integrated circuit dies. At 606, a fault is identified in one or more of the first integrated circuit dies based on the received test results data from the first integrated circuit dies.

At 608, 610, 612, scan testing is performed on integrated circuit dies that have been connected to one another as part of an integrated circuit package. At 608, the series of particular test patterns is sequentially transmitted to a plurality of second integrated circuit dies via an input of an initial integrated circuit die of the second integrated circuit dies, the second integrated circuit dies being coupled via an integrated circuit package. At 610, test results data is received from each of the second integrated circuit dies via an output of a final integrated circuit die of the second integrated circuit dies, and at 612, a fault is identified in one or more of the second integrated circuit dies based on the received test results data from the second integrated circuit dies.

Figure 7:
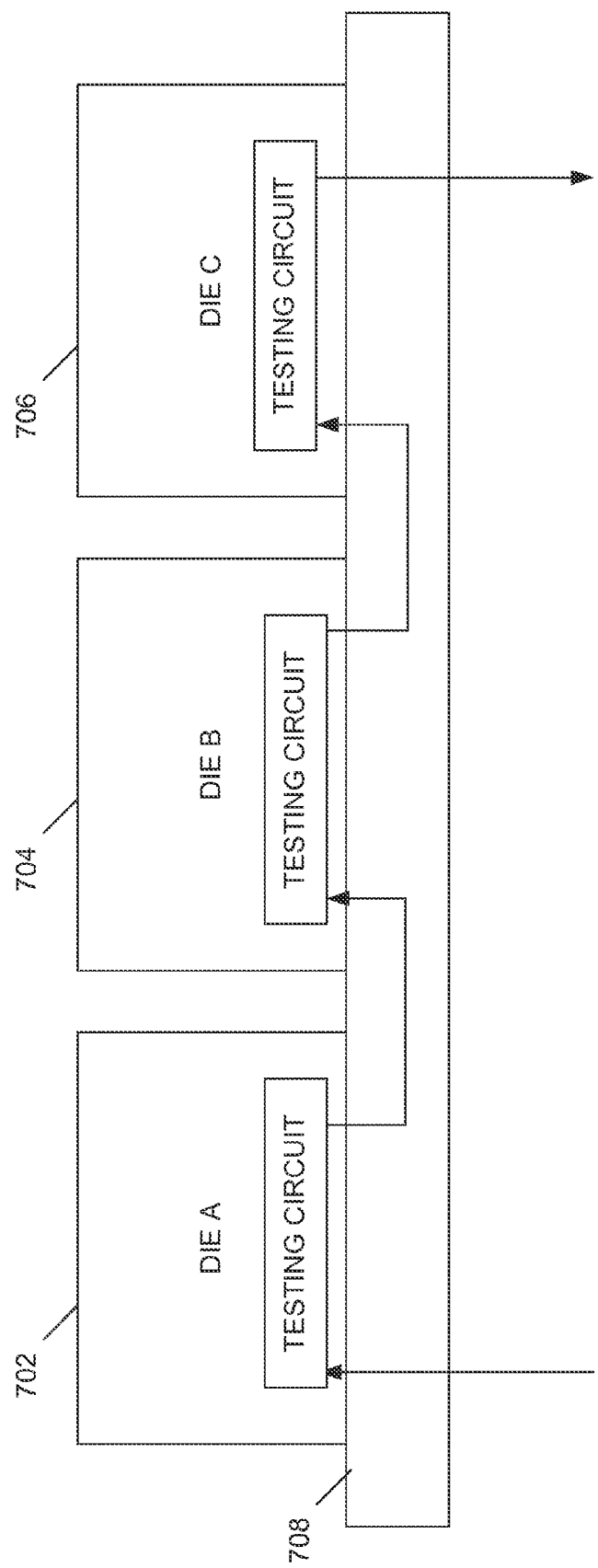
FIG. 7 is a diagram depicting an interconnection of integrated circuit dies via a mechanism other than an interposer, such as a printed circuit board, in accordance with one embodiment of the disclosure.

This application uses examples to illustrate the invention. The patentable scope of the invention includes other examples. For example, FIG. 7 is a diagram depicting an interconnection of integrated circuit dies via a mechanism other than an interposer, such as a printed circuit board. Each of a first integrated circuit die 702, a second integrated circuit die 704, and a third integrated circuit die 706 are coupled to the printed circuit board 708. Integrated circuit die B 704 does not have any external connections available for communicating with an external testing circuit. Thus, sort type testing cannot be performed on the integrated circuit dies 702, 704, 706, where the external testing circuit directly communicates with each of the integrated circuit dies 702, 704, 706. However, the integrated circuit dies 702, 704, 706 do have connections to one another, such as through printed circuit board traces. Thus, the external testing circuit communicates with all of the integrated circuit dies 702, 704, 706 for testing via integrated circuit die A 702 and its associated testing circuit.

It is claimed:

1. An integrated circuit system, comprising:
a plurality of separate integrated circuit dies that are coupled together to form an integrated circuit package, a first integrated circuit die including an input and a last integrated circuit die including an output, ones of the plurality of integrated circuit dies comprising:
a testing circuit associated with a corresponding integrated circuit die, the testing circuit including a testing path for testing functionality of the corresponding integrated circuit die, a bypass path bypassing the testing path, and control circuitry for selecting between an output of the testing path and an output of the bypass path, the control circuitry being configured to select the output of the testing path or the output of the bypass path and to pass the selected output to a subsequent integrated circuit die among the plurality of coupled circuit dies, wherein the testing path comprises,
a decompression circuit configured to receive test stimulus data and to generate decompressed stimulus data, and
testing circuitry configured to generate test results data based on scan chain testing of the decompressed stimulus data.

2. The integrated circuit package of claim 1, wherein the input of the first integrated circuit die is configured to receive test stimulus data from an external testing circuit, and wherein the output of the last integrated circuit die is configured to provide test results data to the external testing circuit.

3. The integrated circuit package of claim 2, wherein the test stimulus data includes a selector signal that indicates which of the integrated circuit dies among the plurality of coupled integrated circuit dies is to be tested in a current cycle.

4. The integrated circuit package of claim 3, wherein the corresponding integrated circuit die is configured to select the output of the testing path when the selector signal indicates that the corresponding integrated circuit die is to be tested in the current cycle, and wherein the corresponding integrated circuit die is configured to select the output of the bypass path when the selector signal indicates that the corresponding integrated circuit die is not to be tested in the current cycle.

5. The integrated circuit package of claim 3, wherein the plurality of integrated circuit dies are identified in a logical order, wherein when the corresponding integrated circuit die is not to be tested in the current cycle, the corresponding integrated circuit die passes test stimulus data or test results data from a prior integrated circuit die to a subsequent integrated circuit die via the bypass path.

6. The integrated circuit package of claim 3, wherein the control circuitry includes a multiplexer, the multiplexer being configured to select the output of the testing path or the output of the bypass path based on the selector signal.

7. The integrated circuit package of claim 2, wherein the corresponding integrated circuit die is configured to determine whether the corresponding integrated circuit die is to be tested in the current cycle based on a timing of receipt of the test stimulus data at the corresponding integrated circuit die.

8. The integrated circuit package of claim 2, wherein the plurality of integrated circuit dies further includes one or more intermediate integrated circuit dies, wherein ones of the intermediate integrated circuit dies are configured not to directly communicate with the external testing circuit.

9. The integrated circuit of package of claim 1, wherein the bypass path is configured to transmit test stimulus data or test results data received from a preceding integrated circuit die to a succeeding integrated circuit die without modification of the test stimulus data or the test results data.

10. The integrated circuit package of claim 1, wherein the plurality of integrated circuit dies are mutually coupled through an interposer as part of a 2.5 dimension integrated circuit system, a 3 dimension integrated circuit system, a die tower integrated circuit system, or a multi-chip module (MCM) integrated circuit system.

11. The integrated circuit package of claim 1, wherein ones of the integrated circuit dies are connected in series.

12. The integrated circuit package of claim 1, wherein the control circuitry is configured to determine whether the corresponding integrated circuit die is currently being tested and to select the output of the testing path or the output of the bypass path based on the determination of whether the corresponding integrated circuit die is currently being tested.

13. A method of testing a plurality of mutually interconnected integrated circuit dies forming an integrated circuit system, comprising:
receiving test stimulus data at an input of a first integrated circuit die of the plurality of serially connected integrated circuit dies;
determining with control circuitry whether the first integrated circuit die is currently being tested at a testing circuit of the first integrated circuit die based on a selector signal in the test stimulus data or a timing of receipt of the test stimulus data;
in response to determining that the first integrated circuit die is currently being tested, decompressing the test stimulus data with a decompression circuit in a testing path of the testing circuit to generate decompressed stimulus data, generating test results data based on scan chain testing of the decompressed stimulus data, and transmitting the test results data from the testing path of the testing circuit of the first integrated circuit die to a next integrated circuit die among the interconnected circuit dies; and
in response to determining that the first integrated circuit die is not currently being tested, transmitting the test stimulus data from a bypass path of the testing circuit of the first integrated circuit die to the next integrated circuit die, the bypass path bypassing the testing path.

14. The method of claim 13, further comprising:
receiving data from the first integrated circuit die at the next integrated circuit die, the received data being test results data or test stimulus data;
determining whether the next integrated circuit die is currently being tested at a testing circuit of the next integrated circuit die;
transmitting test results data from a testing path of the testing circuit of the next integrated circuit die when the next integrated circuit die is currently being tested; and
transmitting the received data from the first integrated circuit die from a bypass path of the testing circuit of the next integrated circuit die when the next integrated circuit die is not currently being tested.

15. The method of claim 13, further comprising:
receiving upstream data from preceding integrated circuit dies at one or more additional integrated circuit dies;
determining whether an additional integrated circuit die is being tested based on selector signal in the upstream data;
outputting bypass data when the additional integrated circuit die is not currently being tested;
outputting test results data generated by the additional integrated circuit die when the additional integrated circuit die is currently being tested.

16. The method of claim 13, further comprising:
outputting from a last integrated circuit die of the plurality of integrated circuit dies to a testing circuit tests results data for a particular integrated circuit die being tested among the plurality of integrated circuit dies.

* * * * *